US006831937B2

United States Patent
Doi et al.

(10) Patent No.: US 6,831,937 B2
(45) Date of Patent: Dec. 14, 2004

(54) METHOD OF FABRICATING SEMICONDUCTOR LASER DEVICE AND SEMICONDUCTOR LASER DEVICE

(75) Inventors: Masato Doi, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/210,382

(22) Filed: Jul. 31, 2002

(65) Prior Publication Data

US 2003/0039286 A1 Feb. 27, 2003

(30) Foreign Application Priority Data

Aug. 2, 2001 (JP) ..................................... P2001-234844

(51) Int. Cl.[7] ................................................. H01S 5/00
(52) U.S. Cl. .............................. 372/43; 372/44; 372/45; 372/46
(58) Field of Search ............................. 372/43, 44, 46, 372/48, 49, 103; 438/22–24, 48, 602–604, 608

(56) References Cited

U.S. PATENT DOCUMENTS

| 4,819,245 A | * | 4/1989 | Morimoto et al. ............. 372/48 |
| 4,951,290 A | * | 8/1990 | Morimoto et al. ............. 372/48 |
| 5,486,490 A | * | 1/1996 | Kakimoto ..................... 438/33 |
| 5,540,346 A | * | 7/1996 | Fujimoto et al. .............. 216/24 |
| 5,852,624 A | * | 12/1998 | Matsuyama et al. .......... 372/44 |
| 6,020,602 A | * | 2/2000 | Sugawara et al. ........... 257/103 |
| 6,158,901 A | * | 12/2000 | Kovacic ....................... 385/88 |
| 6,165,811 A | * | 12/2000 | Lee et al. ..................... 438/45 |
| 6,204,078 B1 | * | 3/2001 | Inomoto ....................... 438/22 |
| 6,316,281 B1 | * | 11/2001 | Lee et al. ..................... 438/31 |
| 6,362,515 B2 | * | 3/2002 | Hayakawa ................... 257/639 |
| 6,546,035 B2 | * | 4/2003 | Imafuji et al. ................. 372/50 |

FOREIGN PATENT DOCUMENTS

| JP | 10-125929 | 5/1998 |
| JP | 2000-332343 | 11/2000 |

* cited by examiner

Primary Examiner—Minsun Oh Harvey
Assistant Examiner—Dung (Michael) T Nguyen
(74) Attorney, Agent, or Firm—Bell, Boyd & Lloyd LLC (57) ABSTRACT

A method of fabricating a semiconductor laser device includes the steps of forming semiconductor layers composed of a first conductive type cladding layer, an active layer, and a second conductive type cladding layer on a substrate, and peeling a device formation region of the semiconductor layers from the substrate and simultaneously forming a resonance mirror on an end portion of the device formation region by irradiating the device formation region with energy beams traveling from the back surface side of the substrate. With this configuration, it is possible to peel a device from a substrate and also form a flat resonance mirror with less damage of crystal by laser abrasion, and further to easily form a high quality resonance mirror without increasing the number of fabrication steps.

29 Claims, 8 Drawing Sheets

METHOD OF FABRICATING SEMICONDUCTOR LASER DEVICE AND SEMICONDUCTOR LASER DEVICE

BACKGROUND OF THE INVENTION

The present invention relates to a method of fabricating a semiconductor laser device and a semiconductor laser device. In particular, the present invention relates to a method of fabricating a semiconductor laser device, which is capable of peeling a device formation region from a substrate and simultaneously forming a resonance mirror of the semiconductor laser device, and a semiconductor laser device fabricated by the fabrication method.

Methods of fabricating a semiconductor laser device have been known. One of the methods involves forming nitride semiconductor layers on a sapphire substrate by crystal growth and dividing the semiconductor layers into individual semiconductor laser devices. With respect to such a fabrication method, since a resonance mirror exerts a large effect on characteristics of a semiconductor laser device, the method of forming the resonance mirror has been regarded as one of important techniques; particularly, in the fabrication of a GaN based semiconductor laser. One of the methods of forming a resonance mirror includes the step of isolating devices from each other by cleavage or etching, wherein an end plane of each of the devices simultaneously formed is taken as a resonance mirror.

In the case of isolating devices from each other by cleavage, device isolation grooves for isolating the devices from each other are formed by etching, and then devices are isolated from each other by cleavage along the device isolation grooves.

In the case of isolating devices from each other by etching, the depth of grooves for isolating the devices from each other must reach the lowermost layer of semiconductor layers from which the devices are to be formed.

In some cases, cleavage is performed without being accompanied by peeling devices from a substrate. In this case, when the devices are isolated from each other by cleavage, the substrate is simultaneously cleaved.

The method of isolating devices from each other by making use of cleavage or etching is disadvantageous in that the crystal of a device isolation plane of each of the devices may be damaged at the time of isolating the devices from each other.

With respect to the quality of a resonance mirror of a device, a semiconductor laser device particularly requires a flat resonance mirror with less damage of crystal. Accordingly, it has been expected to develop a fabrication method capable of forming a high quality resonance mirror without increasing the number of fabrication steps.

In the process of fabricating a GaN based semiconductor device, devices in the form of chips are often isolated from each other by using a dicer or the like. Such a process requires much labor to isolate the devices from each other, and has much difficulty in finely isolating the devices from each other while avoiding electrodes and the like spread in the horizontal direction. This process has another disadvantage that, since sapphire substrate and a nitride such as GaN each have a high hardness, a cutting margin of at least 20 μm is required for dicing, thereby making it further difficult to finely isolate chips from each other by dicing.

In the case of dividing nitride semiconductor layers stacked on a sapphire substrate into individual semiconductor laser devices by cleavage, since not only the nitride semiconductor layers constituting main portions of the devices but also the sapphire substrate is cleaved, the sapphire substrate cannot be repeatedly used for fabricating semiconductor laser devices.

In the case of isolating devices from each other by making use of dry etching or dicing, in general, the crystal of a device isolation plane of each of the devices is necessarily damaged. As such, even if through-dislocations from the substrate side and the like are suppressed during fabrication of semiconductor laser devices, crystal characteristics of the devices are degraded by dry etching or dicing at the final isolation step. The use of dry etching or dicing for isolating devices from each other is also disadvantageous in correspondingly increasing the number of fabrication steps.

For a semiconductor laser device using GaN semiconductors, in the case of forming an end plane of the semiconductor laser by cleavage or etching, since each of the GaN semiconductors have a hexagonal crystal structure, it is difficult to form a flat end plane as compared with another type of semiconductor laser. If an end face of a device is tilted or uneven, a reflectance is degraded, thereby increasing a threshold value of a current required for laser oscillation.

SUMMARY OF THE INVENTION

An object of the present invention is to provide a method of fabricating a semiconductor laser device, which is capable of peeling devices from a substrate and isolating the devices from each other, and simultaneously forming a flat resonance mirror with less damage of crystal on an end plane of each of the devices in one fabrication step, and to provide a semiconductor laser device fabricated by the fabrication method.

To achieve the above object, according to a first embodiment of the present invention, there is provided a method of fabricating a semiconductor laser device, including the steps of: forming semiconductor layers composed of a first conductive type cladding layer, an active layer, and a second conductive type cladding layer on a substrate; and peeling a device formation region of the semiconductor layers from the substrate and simultaneously forming a resonance mirror on an end portion of the device formation region by irradiating the device formation region with energy beams traveling from the back surface side of the substrate.

With this configuration, since the semiconductor layers composed of the first conductive type cladding layer, the active layer, and the second conductive type cladding layer are formed on the substrate and each of semiconductor laser devices mainly formed by the semiconductor layers is irradiated with energy beams, it is possible to carry out the step of peeling the devices from the substrate simultaneously with the step of isolating the devices from each other. At this time, since the semiconductor layers can be cleaved by irradiating the semiconductor layers with energy beams traveling from the back surface side of the substrate, the devices can be isolated from each other easily. Also, by selectively irradiating a region defined by projecting a bottom plane of the semiconductor laser device to the back surface of the substrate, the semiconductor laser having a specific size can be fabricated. Further, since the end plane of a semiconductor laser device formed by isolation of the device from another device is flattened and has less damage of crystal, the performance of the semiconductor laser device can be enhanced by using the end plane of the device as a resonance mirror. In addition, by forming a window region while avoiding the vicinity of a portion corresponding to the resonance mirror to be formed by isolation of a semiconductor laser device, it is possible to more easily isolate the device from another device.

According to a second embodiment of the present invention, there is provided a method of fabricating a semiconductor laser device, including the steps of: forming a selective growth mask having an opening portion formed into a stripe shape on a base body; forming a crystal layer by selective growth from the opening portion; forming semiconductor layers composed of a first conductive type cladding layer, an active layer, and a second conductive type cladding layer on the crystal layer; and peeling a device formation region of the crystal layer and the semiconductor layers from the base body and simultaneously forming a resonance mirror on an end portion of the device formation region by irradiating the device formation region with energy beams traveling from the back surface side of the base body. In particular, since the semiconductor layer having a tilt crystal plane tilted from the principal plane of the substrate has desirable crystallinity and allows formation of a flat resonance mirror perpendicular to the semiconductor layers, it is possible to form a high performance semiconductor laser device by using such a semiconductor layer having a tilt crystal plane.

According to the method of fabricating a semiconductor laser device of the present invention, since the step of peeling the devices from the substrate can be carried out simultaneously with the step of isolating the devices from each other, it is possible to simplify the fabrication process and, hence, to reduce the fabrication cost.

In addition, the method of fabricating a semiconductor laser device according to the present invention can be applied to a method of fabricating a device other than a semiconductor laser device. Even in this case, since the step of peeling devices from a substrate can be carried out simultaneously with the step of isolating the devices from each other, the fabrication process can be simplified.

Additional features and advantages of the present invention are described in, and will be apparent from, the following Detailed Description of the Invention and the Figures.

DETAILED DESCRIPTION OF THE INVENTION

First Embodiment

A first embodiment of a method of fabricating a semiconductor laser device according to the present invention will be described with reference to FIGS. 1A to 3B.

This method basically includes the steps of forming a stack of semiconductor layers composed of a first conductive type cladding layer, an active layer, and a second conductive type cladding layer on a substrate, and selectively irradiating a target device portion of the stacked structure with an energy beam traveling from the back surface side of the substrate, thereby peeling the target device from the substrate and isolating the target device from devices adjacent to the target device, and simultaneously forming a resonance mirror of the target device.

Figure 1A:
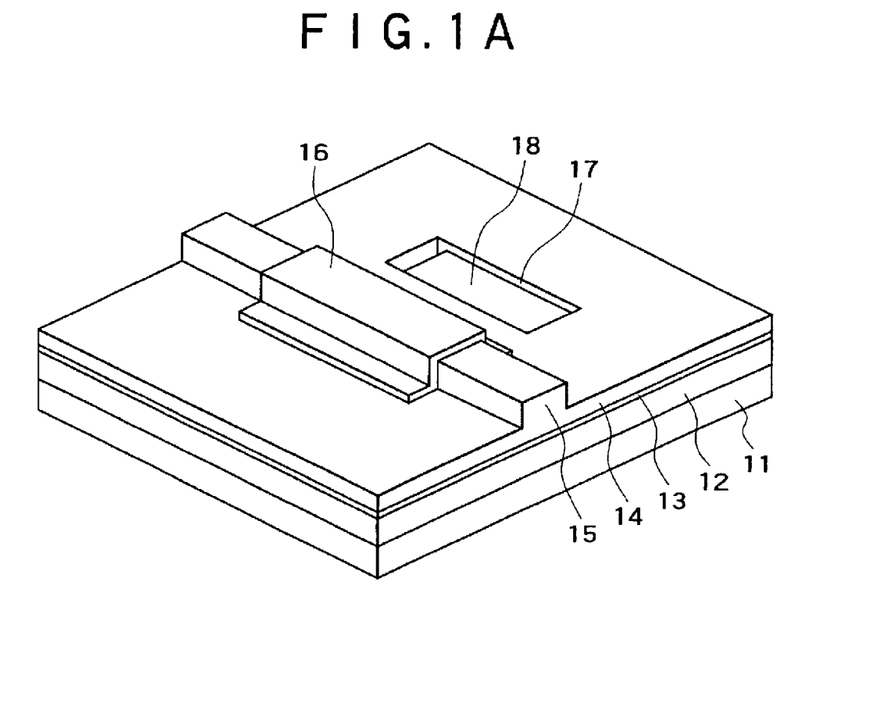
FIGS. 1A and 1B are a perspective view and a sectional view, respectively, showing a stacked structure before a device is isolated, wherein the structure is fabricated by a method of fabricating a semiconductor laser device according to a first embodiment of the present invention.
Figure 1B:
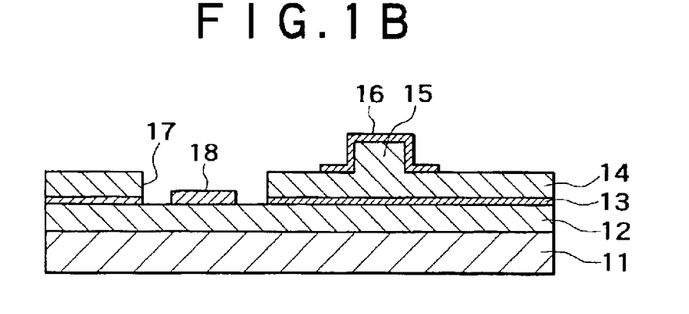

FIGS. 1A and 1B are a perspective view and a sectional view, respectively, showing a stacked structure of semiconductor layers for forming semiconductor laser devices in a state before the devices are isolated from each other.

A GaN layer 12 doped with silicon is formed as an n-type cladding layer on a sapphire substrate 11. It is to be noted that although the sapphire substrate 11 is used in this embodiment, any other substrate may be used insofar as a wurtzite type compound semiconductor layer is formable thereon.

Examples of the substrates usable in this embodiment include substrates made from sapphire ($Al_2O_3$ having an A-plane, an R-plane, or a C-plane), SiC (having a structure of 6H, 4H, or 3C), GaN, ZnS, ZnO, AlN, and InAlGaN. In particular, such a material may be of a hexagonal system or cubic system; preferably, the hexagonal system., In the case of using the sapphire substrate as in this embodiment, the C-plane of sapphire may be taken as a principal plane of the substrate. The sapphire substrate with the C-plane of sapphire taken as a principal plane has been often used for growth of gallium nitride (GaN) based compound semiconductors. The C-plane of sapphire taken as a principal plane of the substrate used in this embodiment is not limited to a strict C-plane but may be tilted therefrom in a range of 5 to 6°.

Even if any impurity is not doped in the GaN layer 12, the conductive type of the GaN layer 12 becomes an n-type because of vacancies of nitrogen produced in crystal. However, in general, a doner impurity such as Si, Ge, or Se may be doped in the GaN layer 12 during crystal growth in order to obtain the n-type GaN layer 12 having a desirable carrier concentration. In addition, since the sapphire substrate 11 having a lattice constant close to that of the GaN layer 12 is used in this embodiment, not any buffer layer may be formed on the sapphire substrate 11. However, in order to suppress dislocations formed in the GaN layer, a buffer layer may be formed on the sapphire substrate 11 at a low temperature. A low temperature buffer layer can be formed by growing a GaN layer having a thickness as thin as 20 to 30 nm at a low temperature of 500° C. As an alternative, there may be adopted a configuration that after a GaN layer is formed on the sapphire substrate 11, a selective mask having an opening portion is formed thereon, and the GaN layer 12 is formed by selective growth from the opening portion. The formation of the GaN layer 12 by selective growth is advantageous in suppressing the density of through-dislocations, thereby enhancing the crystallinity of the GaN layer 12, and also reducing the density of dislocations in a crystal layer to be grown on the GaN layer 12.

In place of the GaN layer 12, a semiconductor layer made from $Al_xIn_yGa_{1-x-y}N$ ($0 \leq x \leq 1$, $0 \leq y \leq 1$) may be formed on the substrate 11. By changing the ratio among the amounts of Al, In, and Ga in the semiconductor layer made from $Al_xIn_yGa_{1-x-y}N$, an energy band gap of the semiconductor layer can be changed. As will be described later, according to the method of fabricating the semiconductor laser device in this embodiment, a target semiconductor laser device is peeled from the substrate 11 and is simultaneously isolated from devices adjacent to the target device by irradiating the target device with an energy beam traveling from the back surface side of the substrate 11. More specifically, in the portion, corresponding to the target semiconductor laser device, of the stacked structure, the GaN layer 12 formed on the substrate 11 absorbs the energy beam, to cause abrasion of GaN of the GaN layer 12, whereby the target device is peeled from the substrate 11 and is simultaneously isolated from the adjacent devices. Accordingly, by forming the semiconductor layer made from $Al_xIn_yGa_{1-x-y}N$ (x and y are variable) as the first layer on the substrate 11, the selective range of the energy beam used for abrasion can be widened. Also, an energy beam having a wavelength absorbable not by the $Al_xIn_yGa_{1-x-y}N$ layer but by a semiconductor layer formed thereon, can be used. In this way, the combination of the energy beam used for abrasion and the semiconductor layer to be subjected to abrasion can be variously changed.

An InGaN layer 13 is formed as an active layer on the GaN layer 12, and a GaN layer 14 doped with magnesium is formed as a p-type cladding layer thereon. The GaN layer 12, the InGaN layer 13, and the GaN layer 14 form a double-hetero structure.

The stacked structure may be configured such that the InGaN layer as the active layer 13 may be sandwiched between two AlGaN layers, or an AlGaN layer may be formed only on one side of the InGaN layer 13. The active layer 13 may be configured as a single bulk active layer but may be configured as a layer having a quantum well structure such as a single quantum well (SQW) structure, a double quantum well (DQW) structure, or a multiple quantum well (MQW) structure. In the case of adopting the multiple quantum well structure, a barrier layer may be used for separating quantum wells from each other as needed. The use of the InGaN layer as the active layer is advantageous in facilitating the fabrication process, as well as enhancing the light emission characteristic of the device.

To obtain a p-type nitride semiconductor layer, an acceptor impurity such as Mg, Zn, C, Be, Ca, or Ba may be doped in crystal of the nitride semiconductor layer. In this case, to obtain the p-type nitride semiconductor layer having a high carrier concentration, the p-type nitride semiconductor layer doped with an acceptor impurity is preferably activated by an annealing treatment in an inert gas atmosphere such as nitrogen or argon at a temperature of 400° C. or more. The activation of the p-type impurity in the p-type nitride semiconductor layer may be made by irradiating the layer with electron beams, microwaves, or light.

The n-type cladding layer 12, the active layer 13, and the p-type cladding layer 14 are formed on the substrate 11, to form a multi-layer structure composed of the GaN based compound semiconductors.

Although the multi-layer structure in this embodiment is configured as a double-hetero structure, it may be configured as a so-called GRIN-SCH (Graded Index Separate Confinement Heterostructure) in which each of the n-type cladding, layer 12 and the p-type cladding layer 14 has a structure that a ratio among the amounts of elements in a ternary or quaternary compound semiconductor is changed, wherein a refractive index of the layer is changed to efficiently confine light in the active layer 13. Specifically, according to this embodiment, if an AlGaN layer in which a ratio among the amounts of Al and Ga is changed so that the refractive index of a portion in the layer becomes large as the portion becomes apart from the active layer 13 is used as each of the n-type cladding layer 12 and the p-type cladding layer 34, it is possible to efficiently confine light in the active layer 33.

The stacked structure of the GaN based semiconductor layers thus obtained is then subjected to reactive ion etching (RIE) from above the p-type cladding layer 14, to form a ridge structure. In this embodiment, a portion, excluding a ridge formation region, of the p-type cladding layer 14 is removed to a depth not to allow exposure of the active layer 13, to form a projecting rib 15 as the ridge structure. The projecting rib 15 has a rectangular cross-section, and extends in the direction perpendicular to the paper plane as shown in FIG. 1B. The extending direction of the projecting rib 15 becomes the [1–100] direction, which is perpendicular to a resonance mirror (which will be described later).

A p-side electrode 16 is formed on the upper portion, forming the projecting rib 15, of the p-type cladding layer 14. To be more specific, as shown in the sectional view of FIG. 1B, the p-side electrode 16 covers not only the projecting rib 15 but also part of the plane, exposed by etching, of the p-type GaN layer 14. Both side edges of the p-side electrode 16 extend in approximately a straight line along a direction parallel to the [1–100] direction. The p-side electrode 16 may be formed by a metal thin film made from Al, Ag, Au, Pt, or the like, or formed by a stack of metal thin films made from Al, Ag, Au, Pt, or the like. To obtain desirable ohmic contact of the p-side electrode 16 with the projecting rib 15 and the part of the exposed plane of the p-type cladding layer 14, an Ni layer may be formed as a contact metal layer on the projecting rib 15 and the part of the exposed plane of the p-type cladding layer 14 before formation of the p-side electrode 16.

By removing part of the upper portion of the p-type GaN layer 14 so as to form the projecting rib 15 extending in the [1–100] direction, a threshold current value upon laser oscillation can be suppressed. Most of a current supplied from the p-side electrode 16 is injected in a region, to which the projecting rib 15 is projected, of the inner plane of the InGaN layer 13. A current constriction structure that can be formed, which allows light confinement in the lateral direction in cross-section by injecting a current only in the region, to which the projecting rib 15 is projected, of the inner plane of the InGaN layer 13. Also, the region, to which the projecting rib 15 is projected, of the InGaN layer 13 extends in the [1–100] direction. Accordingly, of light generated in the InGaN layer 13, a light component emerging in the [1–100] direction contributes to light amplification. Since a resonance mirror to be described later is formed on an M-plane, that is, (1–100) plane perpendicular to the [1–100] direction, light reflected from the resonance mirror is reciprocated in parallel to the [1–100] direction, thereby allowing laser oscillation with a small threshold current value. In place of formation of the ridge structure, another current constriction structure may be provided by forming the p-side electrode on the upper surface of the p-type GaN layer. In this case, the p-side electrode may be formed into a rectangular shape with its longitudinal direction taken in parallel to the [1–100] direction.

An n-side electrode 18 is then formed as shown in FIG. 1B. After the n-type GaN layer 12, the InGaN layer 13, and the p-type GaN layer 14 are stacked, an opening portion is formed in the InGaN layer 13 and the p-type GaN layer 14 by etching in such a manner that the n-type GaN layer 12 is exposed from the opening portion. The region, exposed from the opening portion, of the n-type GaN layer 12 is taken as an n-side electrode extraction region 17, and the n-side electrode 18 is formed on the n-side electrode region 17 in such a manner as to be in electric contact with the n-type GaN layer 12. The n-side electrode 18 may have a Ti/Al/Pt/Au structure.

The ridge structure is not limited to that described in this embodiment, but may be variously changed. For example, the stacked structure may be etched from above the p-type cladding layer 14 such that the projecting rib 15 contains the p-type GaN layer 14, the InGaN layer 13, and the n-type GaN layer 12. In this case, by etching the p-type GaN layer 14 and the InGaN layer 13 until the n-type GaN layer 12 is exposed, the n-side electrode 18 can be directly formed on the exposed n-type GaN layer 12 without formation of any opening portion.

Figure 2A:
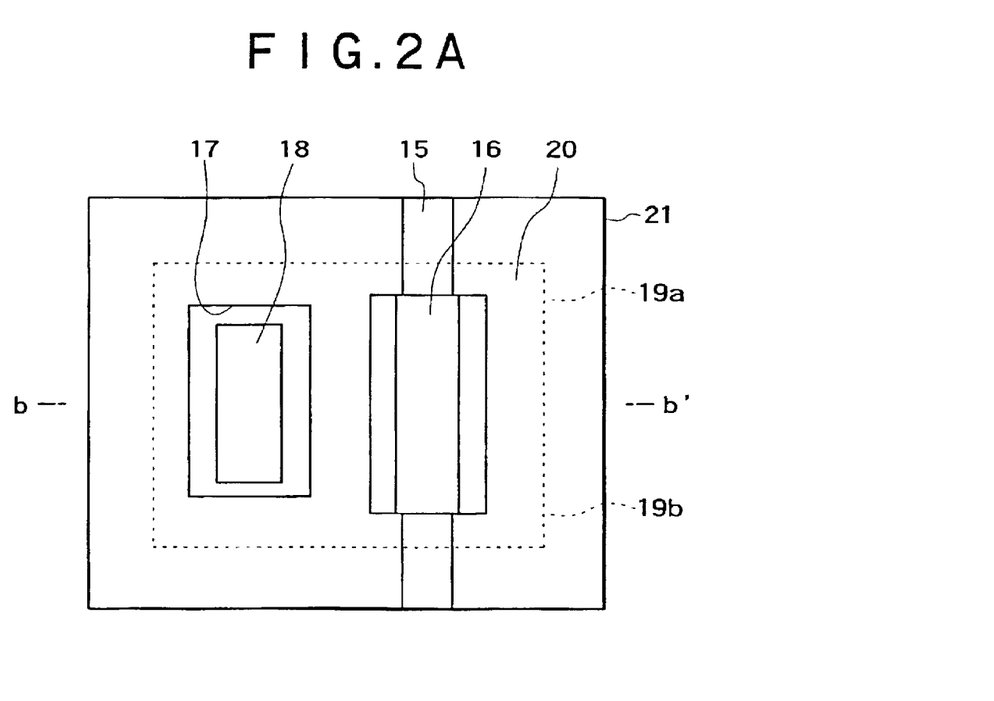
FIGS. 2A and 2B are a plan view and a sectional view, respectively, taken along line b–b' of FIG. 2A, showing a device isolation step of the method of fabricating a semiconductor laser device according to the first embodiment.
Figure 2B:
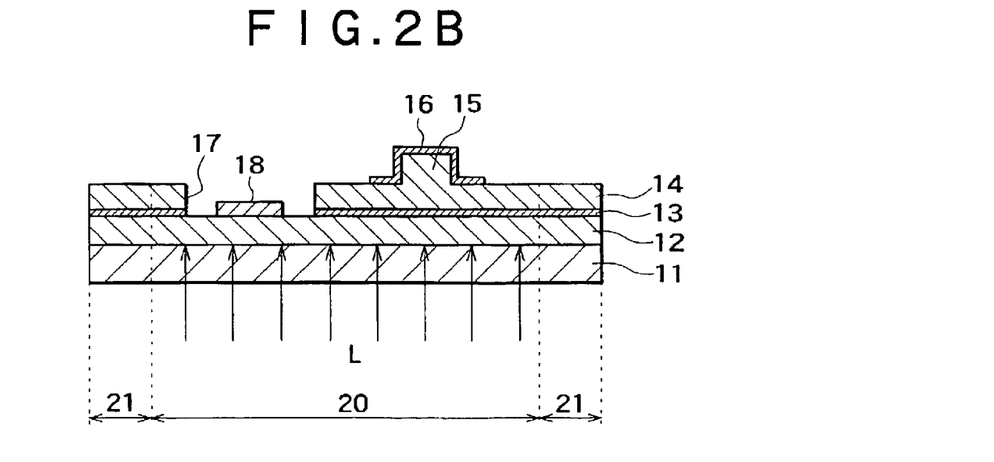

FIGS. 2A and 2B are views showing steps of irradiating a portion, corresponding to a target semiconductor laser device, of the stacked structure formed on the substrate 11 with an energy beam traveling from the back surface side of the substrate, to peel the target device from the substrate and isolate the target device from devices adjacent to the target device, and simultaneously forming a resonance mirror of the target device, wherein FIG. 2A is a plan view and FIG. 2B is a sectional view, respectively, taken along line b–b' of FIG. 2A.

An irradiation region 20 corresponding to the target semiconductor laser device is irradiated with energy beams L traveling from the back surface side of the substrate 11. The energy beams L reach the GaN layer 12 in the vicinity of the substrate 11. As the energy beam L, there can be used a high output pulse ultraviolet laser beam such as an excimer laser beam. The irradiation region 20 is defined as a projected region formed by projecting a rectangular region containing the p-side electrode 16 and the n-side electrode 18 on the back surface of the substrate 11. The irradiation region 20 is partitioned from a non-irradiation region 21, which is not irradiated with the energy beams L, by a pair of boundaries 19a extending in a direction parallel to the [1–100] direction along which the projecting rib 15 extends, and a pair of boundaries 19b extending in a direction perpendicular to the [1–100] direction.

The excimer laser beams L emitted to the back surface side of the substrate 11 reach the GaN layer 12 in the vicinity of the substrate 11, to cause abrasion of GaN of the GaN layer 12. Since the sapphire substrate 11 does not absorb the excimer laser beams L, the excimer laser beams L reach the GaN layer 12 while being little attenuated. The excimer laser beams L are absorbed by the n-type GaN layer 12, to decompose GaN of the n-type GaN layer 12 into gallium (Ga) and $N_2$ gas, thereby reducing a bonding force between the substrate 11 and the GaN layer 12. At this time, heat generated by decomposition of GaN causes a difference between a temperature of the interface between the n-type GaN layer 12 and the substrate 11 in the irradiation region 20 and a temperature of the interface therebetween in the non-irradiation region 21, so that stress caused by crystal strain due to the temperature difference is given to the boundaries 19a and 19b between the irradiation region 20 and the non-irradiation region 21. As a result, the portion, corresponding to the target semiconductor laser device, of the stacked structure including the n-type GaN layer 12, the InGaN layer 13, and the p-type GaN layer 14 is cleaved along planes containing the boundaries 19a and 19b and extending in the direction perpendicular to the substrate 11. In addition, the $N_2$ gas generated by abrasion of GaN is accumulated and expanded at the boundaries 19a and 19b, to apply stress to the boundaries 19a and 19b. This helps the cleavage of the portion, corresponding to the target semiconductor laser device, of the stacked structure including the n-type GaN layer 12, the InGaN layer 13, and the p-type GaN layer 14 along the boundaries 19a and 19b. Specifically, in the case where the GaN layer doped with silicon is formed as the first layer on the substrate 11 as described in this embodiment, the portion, corresponding to the target semiconductor laser device, of the stacked structure can be easily cleaved by irradiating the portion, corresponding to the device, of the stacked structure with excimer laser beams having an energy density ranging from 400 to 500 mL/cm$^2$.

At this time, the projecting rib 15 extending in the [1–100] direction is also cleaved along the boundaries 19b.

As described above, the portion, corresponding to the target semiconductor laser device, of the stacked structure including the n-type GaN layer 12, the InGaN layer 13, and the p-type GaN layer 14 is cleaved along the boundaries 19a and 19b. Of these boundaries 19a and 19b, the boundaries 19b are M-planes; that is, (1–100) planes. In the case of forming a stacked structure including GaN based semiconductor layers stacked by crystal growth, the stacked structure is easier to be cleaved along the M-plane as compared with cleavage along any other crystal plane, and more concretely, in the case of dividing a stacked structure including GaN based semiconductor layers as in this embodiment into individual semiconductor devices, the semiconductor laser devices can be isolated from each other easily by cleavage along the M-planes.

Figure 3A:
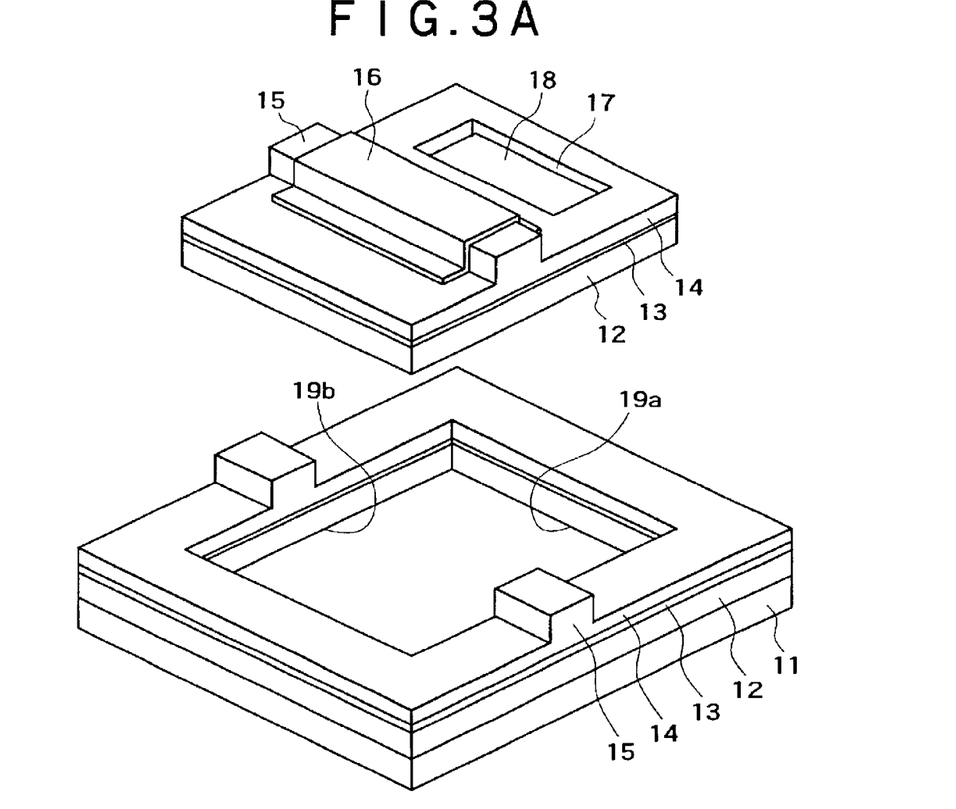
FIGS. 3A and 3B are a perspective view and a sectional view, respectively, showing the stacked structure after the device is isolated, wherein the structure is fabricated by the method of fabricating a semiconductor laser device according to the first embodiment.
Figure 3B:
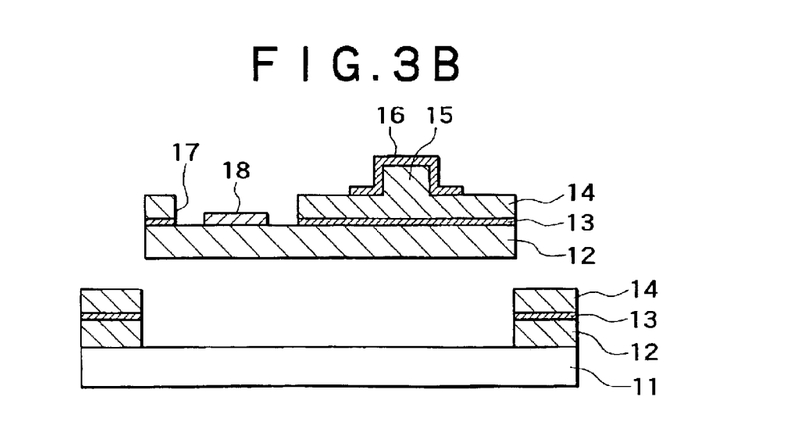

FIG. 3 shows the target semiconductor laser device isolated from the stacked structure including the n-type GaN layer 12, the InGaN layer 13, and the p-type GaN layer 14.

For the target semiconductor laser device thus isolated from the stacked structure, in particular, the isolated plane obtained by cleavage along the M-plane is significantly flattened, and has less damage of crystal. As a result, it is possible to enhance the performance of the semiconductor laser device by using the isolated plane having the M-plane as a resonance mirror.

Second Embodiment

A second embodiment of the method of fabricating a semiconductor laser device according to the present invention will be described with reference to FIGS. 4 to 6.

The method according to this embodiment is the same as the method according to the first embodiment except that a window region is provided around a target semiconductor laser device.

Figure 4:
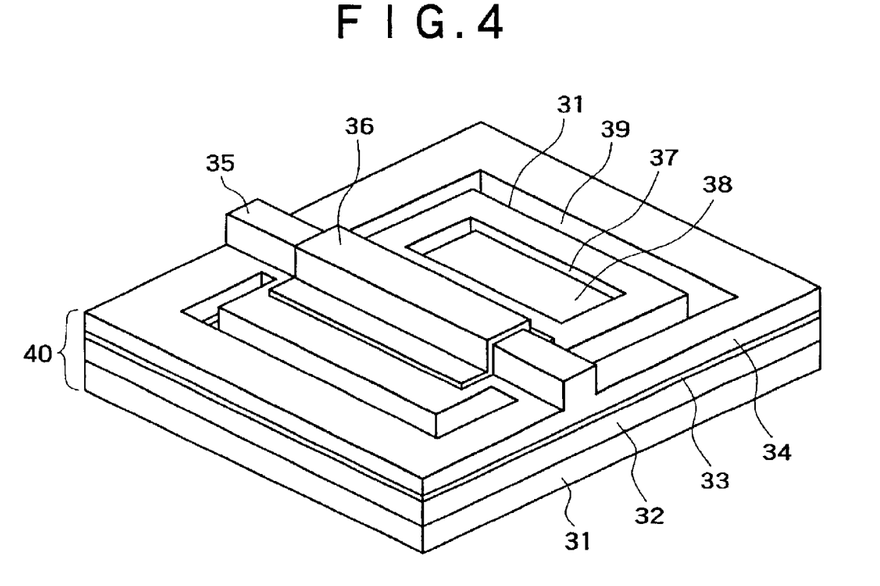
FIG. 4 is a perspective view showing a stacked structure before a device is isolated, which structure is fabricated by a method of fabricating a semiconductor laser device according to a second embodiment of the present invention.

FIG. 4 is a perspective view showing a stacked structure of semiconductor layers for forming semiconductor laser devices in a state before the devices are isolated from each other.

As shown in FIG. 4, a GaN layer 32 doped with silicon is formed as an n-type cladding layer on a sapphire substrate 31. It is to be noted that although the sapphire substrate 11 is used in this embodiment, any other substrate may be used insofar as a wurtzite type compound semiconductor layer is formable thereon.

Examples of the substrates usable in this embodiment include substrates made from sapphire ($Al_2O_3$ having an A-plane, an R-plane, or a C-plane), SiC (having a structure of 6H, 4H, or 3C), GaN, ZnS, ZnO, AlN, and InAlGaN. In particular, such a material may be of a hexagonal system or cubic system; preferably, the hexagonal system. In the case of using the sapphire substrate as in this embodiment, the C-plane of sapphire may be taken as a principal plane of the substrate. The sapphire substrate with the C-plane of sapphire taken as a principal plane often has been used for growth of gallium nitride (GaN) based compound semiconductors. The C-plane of sapphire taken as a principal plane of the substrate used in this embodiment is not limited to a strict C-plane but may be tilted therefrom in a range of 5 to 6°.

Even if any impurity is not doped in the GaN layer 32, the conductive type of the GaN layer 32 becomes an n-type because of vacancies of nitrogen produced in crystal. However, in general, a doner impurity such as Si, Ge, or Se may be doped in the GaN layer 32 during crystal growth in order to obtain the n-type GaN layer 32 having a desirable carrier concentration. In addition, since the sapphire substrate 31 having a lattice constant close to that of the GaN layer 32 is used in this embodiment, not any buffer layer may be formed on the sapphire substrate 11. However, in order to suppress dislocations formed in the GaN layer, a buffer layer may be formed on the sapphire substrate 31 at a low temperature. A low temperature buffer layer can be formed by growing a GaN layer having a thickness as thin as 20 to 30 nm at a low temperature of 500° C.

In place of the GaN layer 32, a semiconductor layer made from $Al_xIn_yGa_{1-x-y}N$ ($0 \leq x \leq 1$, $0 \leq y \leq 1$) may be formed on the substrate 31. By changing the ratio among the amounts of Al, In, and Ga in the semiconductor layer made from $Al_xIn_yGa_{1-x-y}N$, an energy band gap of the semiconductor layer can be changed. As will be described later, according to the method of fabricating the semiconductor laser device in this embodiment, a target semiconductor laser device is peeled from the substrate 31 and is simultaneously isolated from devices adjacent to the target device by irradiating the target device with an energy beam traveling from the back surface side of the substrate 31. More specifically, in the portion, corresponding to the target semiconductor laser device, of the stacked structure, the GaN layer 32 formed on the substrate 31 absorbs the energy beam, to cause abrasion of GaN of the GaN layer 32, whereby the target device is peeled from the substrate 31 and is simultaneously isolated from the adjacent devices. Accordingly, by forming the semiconductor layer made from $Al_xIn_yGa_{1-x-y}N$ (x and y are variable) as the first layer on the substrate 31, the selective range of the energy beam used for abrasion can be widened. Also, an energy beam having a wavelength absorbable not by the $Al_xIn_yGa_{1-x-y}N$ layer, but by a semiconductor layer formed thereon, can be used. In this way, the combination of the energy beam used for abrasion and the semiconductor layer to be subjected to abrasion can be variously changed.

An InGaN layer 33 is formed as an active layer on the GaN layer 32, and a GaN layer 34 doped with magnesium is formed as a p-type cladding layer thereon. The GaN layer 32, the InGaN layer 33, and the GaN layer 34 form a double-hetero structure.

The stacked structure may be configured such that the InGaN layer 33 as the active layer may be sandwiched between two AlGaN layers, or an AlGaN layer may be formed only on one side of the InGaN layer 33. The active layer 33 may be configured as a single bulk active layer, but also may be configured as a layer having a quantum well structure such as a single quantum well (SQW) structure, a double quantum well (DQW) structure, or a multiple quantum well (MQW) structure. In the case of adopting the multiple quantum well structure, a barrier layer may be used for separating quantum wells from each other as needed. The use of the InGaN layer as the active layer is advantageous in facilitating the fabrication process, as well as enhancing the light emission characteristic of the device.

To obtain a p-type nitride semiconductor layer, an acceptor impurity such as Mg, Zn, C, Be, Ca, or Ba may be doped in crystal of the nitride semiconductor layer. In this case, to obtain the p-type nitride semiconductor layer having a high carrier concentration, the p-type nitride semiconductor layer doped with an acceptor impurity is preferably activated by an annealing treatment in an inert gas atmosphere such as nitrogen or argon at a temperature of 400° C. or more. The activation of the p-type impurity in the p-type nitride semiconductor layer may be made by irradiating the layer with electron beams, microwaves, or light.

The n-type cladding layer 32, the active layer 33, and the p-type cladding layer 34 are formed on the substrate 31, to form a multi-layer structure composed of the GaN based compound semiconductors.

Although the multi-layer structure in this embodiment is configured as a double-hetero structure, it may be configured as the above-described GRIN-SCH (Graded Index Separate Confinement Heterostructure) in which each of the n-type cladding layer 32 and the p-type cladding layer 34 has a structure that a ratio among the amounts of elements in a ternary or quaternary compound semiconductor is changed, wherein a refractive index of the layer is changed to efficiently confine light in the active layer 33. Specifically, according to this embodiment, if an AlGaN layer in which a ratio among the amounts of Al and Ga is changed so that the refractive index of a portion in the layer becomes large as the portion becomes apart from the active layer 33 is used as each of the n-type cladding layer 32 and the p-type cladding layer 34, it is possible to efficiently confine light in the active layer 33.

The stacked structure of the GaN based semiconductor layers thus obtained is then subjected to reactive ion etching (RIE) from above the p-type cladding layer 34, to form a ridge structure. In this embodiment, a portion, excluding a ridge formation region, of the p-type cladding layer 34 is removed to a depth not to allow exposure of the active layer 33, to form a projecting rib 35 as the ridge structure. The projecting rib 35 has a rectangular cross-section, and extends in the [1–100] direction, which is perpendicular to a resonance mirror (which will be described later).

A window region 39 is formed in a stacked structure 40 including the n-type GaN layer 32, the InGaN layer 33, and the p-type GaN layer 34 in such a manner as to surround a target semiconductor laser device to be isolated in the subsequent step. Concretely, after the projecting rib 35 is formed by etching, the portion, corresponding to the window region 39, of the stacked structure 40 is removed by etching (for example, RIE) from above the P-type GaN layer 34 until the substrate 31 is exposed, to form the window region 39. At this time, portions, located under the projecting rib 35, of the p-type GaN layer 34, the InGaN layer 33, and the n-type GaN layer 32 are not removed by etching. When the target semiconductor laser device is isolated from the stacked structure 40 formed on the substrate 31 by cleavage in the subsequent step, the portions, located under the projecting rib 35, of the p-type GaN layer 34, the InGaN layer 33, and the n-type GaN layer 32 form device isolation planes serving as resonance mirrors of the device.

A p-side electrode 36 is formed on the upper portion, forming the projecting rib 35, of the p-type cladding layer 34. The p-side electrode 36 covers not only the upper surface of the projecting rib 15 but also part of the plane, exposed by etching, of the p-type GaN layer 34. Both side edges of the p-side electrode 36 extend in approximately a straight line along a direction parallel to the [1–100] direction. The p-side electrode 36 may be formed by a metal thin film made from Al, Ag, Au, Pt, or the like or formed by a stack of metal thin films made from Al, Ag, Au, Pt, or the like. To obtain desirable ohmic contact of the p-side electrode 36 with the projecting rib 35 and the part of the exposed plane of the p-type cladding layer 34, an Ni layer may be formed as a contact metal layer on the projecting rib 35 and the part of the exposed plane of the p-type cladding layer 34 before formation of the p-side electrode 36.

By removing part of the upper portion of the p-type GaN layer 34 so as to form the projecting rib 35 extending in the [1–100] direction, a threshold current value upon laser oscillation can be suppressed. Most of a current supplied from the p-side electrode 36 is injected in a region, to which the projecting rib 35 is projected, of the inner plane of the InGaN layer 33. A current constriction structure thus can be formed, which allows light confinement in the lateral direction in cross-section by injecting a current only in the region, to which the projecting rib 35 is projected, of the inner plane of the InGaN layer 33. Also, the region, to which the projecting rib 35 is projected, of the InGaN layer 33 extends in the [1–100] direction. Accordingly, of light generated in the InGaN layer 33, a light component emerged in the [1–100] direction contributes to light amplification. Since a resonance mirror to be described later is formed on an M-plane, that is, (1–100) perpendicular to the [1–100] direction, light reflected from the resonance mirror is reciprocated in parallel to the [1–100] direction, thereby allowing laser oscillation with a small threshold current value. In place of formation of the ridge structure, another current constriction structure may be provided by forming the p-side electrode on the upper surface of the p-type GaN layer. In this case, the p-side electrode may be formed into a rectangular shape with its the longitudinal direction taken in parallel to the [1–100] direction.

An n-side electrode 38 is then formed. After the n-type GaN layer 32, the InGaN layer 33, and the p-type GaN layer 34 are stacked, an opening portion is formed in the InGaN layer 33 and the p-type GaN layer 34 in such a manner that the n-type GaN layer 32 is exposed from the opening portion. The region, exposed from the opening portion, of the n-type GaN layer 32 is taken as an n-side electrode extraction region 37, and the n-side electrode 38 is formed on the n-side electrode region 37 in such a manner as to be in electric contact with the n-type GaN layer 32. The n-side electrode 38 may have a Ti/Al/Pt/Au structure.

The ridge structure is not limited to that described in this embodiment, but may be variously changed. For example, the stacked structure may be etched from above the p-type cladding layer 34 such that the projecting rib 35 contains the p-type GaN layer 34, the InGaN layer 33, and the n-type GaN layer 32. In this case, by etching the p-type GaN layer 34 and the InGaN layer 33 until the n-type GaN layer 32 is exposed, the n-side electrode 38 can be directly formed on the exposed n-type GaN layer 32 without formation of any opening portion.

Figure 5A:
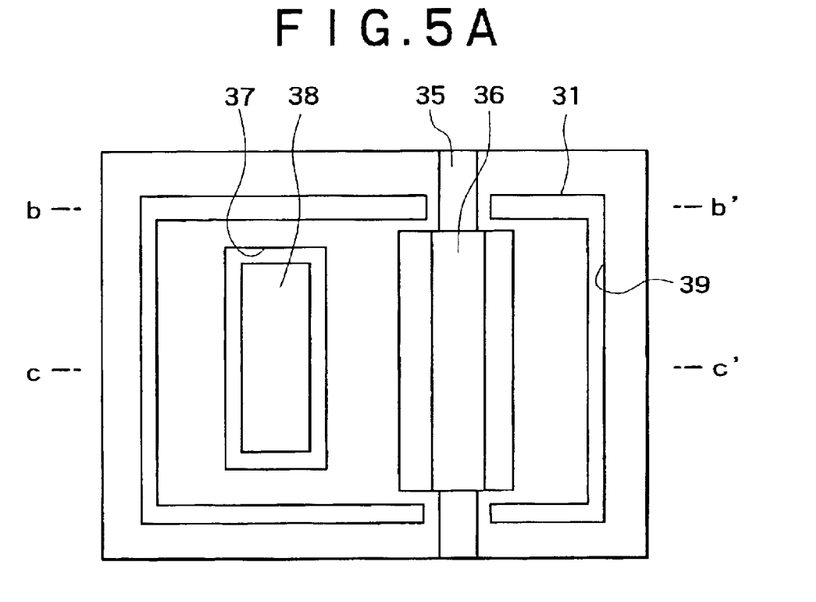
FIGS. 5A, 5B, and 5C are a plan view, a sectional view taken along line b–b' of FIG. 5A, and a sectional view taken along line c–c' of FIG. 5A, respectively, showing a device isolation step of the method of fabricating a semiconductor laser device according to the second embodiment.
Figure 5B:
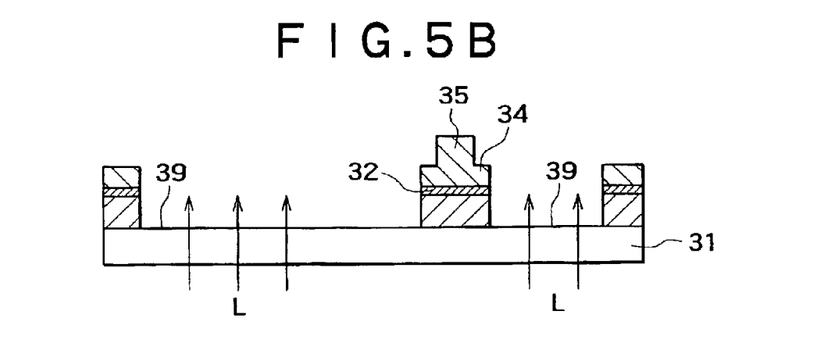
Figure 5C:
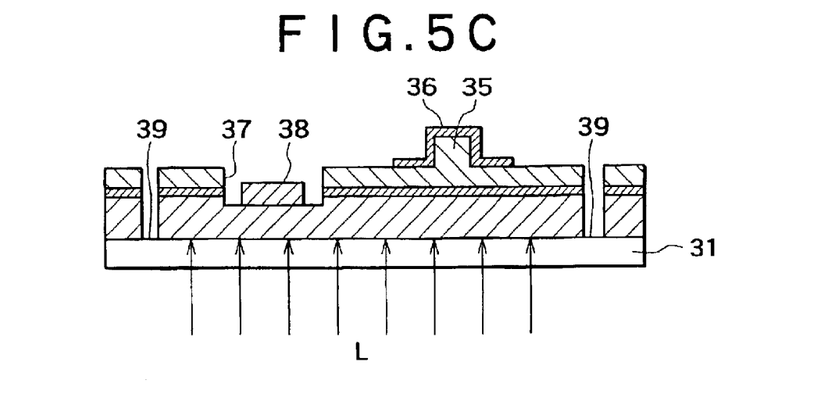

FIGS. 5A to 5C are views showing steps of irradiating a portion, corresponding to a target semiconductor laser device, of the stacked structure formed on the substrate 31 with an energy beam traveling from the back surface side of the substrate, to peel the target device from the substrate and isolate the target device from devices adjacent to the target device, and simultaneously forming a resonance mirror of the target device, wherein FIG. 5A is a plan view, FIG. 5B is a sectional view taken along line b–b' of FIG. 5A, and FIG. 5C is a sectional view taken along line c–c' of FIG. 5A.

A region, defined by projecting the target semiconductor laser device surrounded by the window region 39 on the substrate 31, is selectively irradiated with energy beams L traveling from the back surface side of the substrate 31. The energy beams L reach the GaN layer 32 in the vicinity of the substrate 31. As the energy beam L, there can be used a high output pulse ultraviolet laser beam such as an excimer laser beam. The eximer laser beams L are absorbed by the n-type GaN layer 32 in the vicinity of the substrate 31, to cause abrasion, thereby reducing a bonding force between the substrate 31 and the GaN layer 32.

Figure 6:
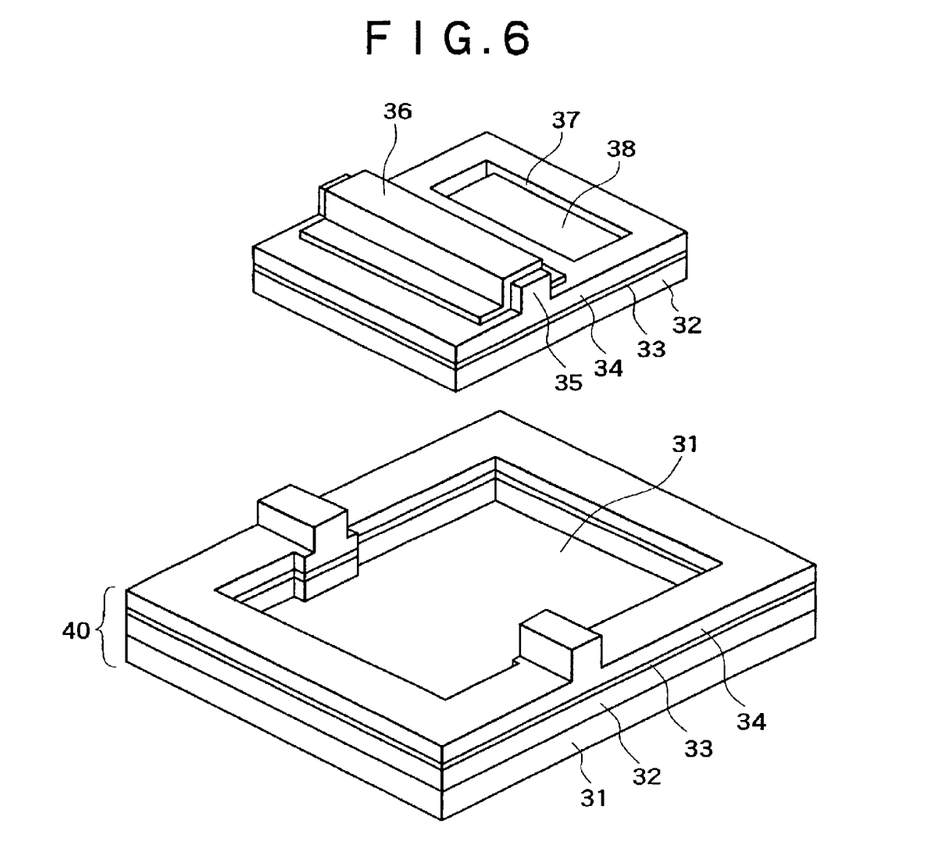
FIG. 6 is a perspective view showing the stacked structure after the device is isolated, which structure is fabricated by the method of fabricating a semiconductor laser device according to the second embodiment.

The region under the projecting rib 35, which is out of the window region 39, is cleaved simultaneously with occurrence of abrasion, with a result that as shown in FIG. 6, the target semiconductor laser device is isolated from devices adjacent thereto, wherein resonance mirrors are formed on both end faces of the projecting rib 35. The resonance mirror is the M-plane, (that is, the (1–100) plane) which is perpendicular to the projecting rib 35. As compared with the first embodiment, according to this embodiment, since the target device is bonded to the surrounding portion of the stacked structure 40 only by the region remaining under the projecting rib 35, the target device is easier to be isolated by cleavage of such a region and the resonance mirror composed of the M-plane is easier to be obtained. Further, since the region under the projecting rib 35 is isolated from the stacked structure 40 not by etching but by cleavage, the isolation plane of the region has little damage of crystal, with a result that a flat resonance mirror with high crystallinity can be formed.

According to this embodiment, the case of dividing a stacked structure including GaN based semiconductor layers into individual semiconductor devices, the semiconductor laser devices can be isolated from each other easily by cleavage along the M-planes. As a result, the semiconductor laser device having the structure shown in FIG. 6 can be obtained. In particular, according to this embodiment, since the window region is formed in such a manner as not to cross the vicinity of the region under the projecting rib, on which the resonance mirrors are to be formed, the target device can be isolated from the stacked structure easily by cleavage of such a region. The isolation plane, which is the M-plane obtained by cleavage, of the target device is significantly flattened and has less damage of crystal. As a result, it is possible to enhance the performance of the semiconductor laser device by using the isolated plane having the M-plane as a resonance mirror.

Third Embodiment

A third embodiment of the method of fabricating a semiconductor laser device according to the present invention will be described with reference to FIGS. 7A to 8B.

This method basically includes the steps of forming a selective growth mask having an opening portion on a base body, forming a semiconductor layer by selective growth from the opening portion, forming a first conductive type cladding layer, an active layer, and a second conductive type cladding layer on the semiconductor layer, and selectively irradiating a target device portion of the stacked structure with an energy beam traveling from the back surface side of the base body, thereby peeling the target device from the base body and isolating the target device from devices adjacent to the target device, and simultaneously forming a resonance mirror of the target device.

Figure 7A:
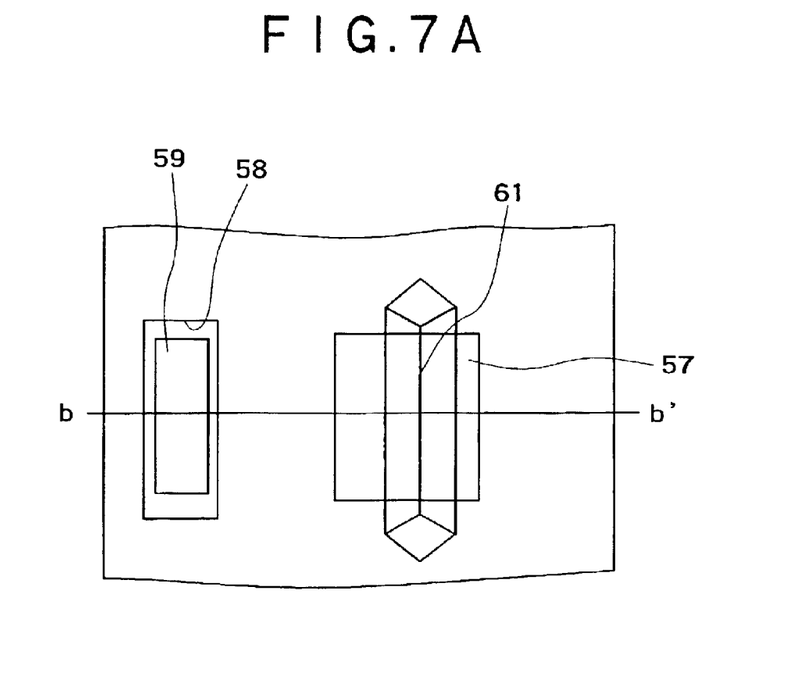
FIGS. 7A and 7B are a plan view and a sectional view taken along line b–b' of FIG. 7A, respectively, showing a stacked structure before a device is isolated, which structure is fabricated by a method of fabricating a semiconductor laser device according to a third embodiment of the present invention.
Figure 7B:
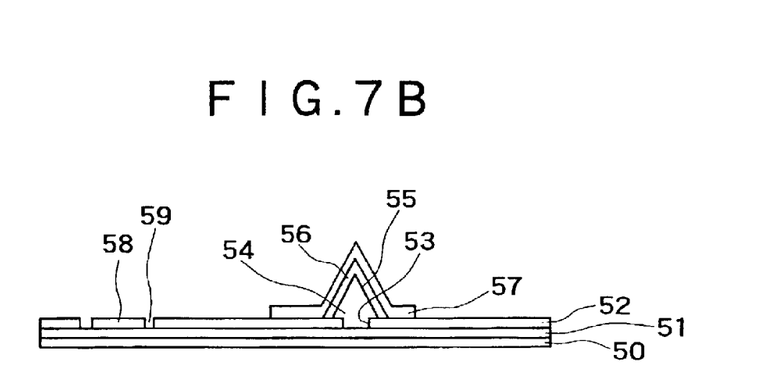

FIGS. 7A and 7B are a plan view and a sectional view, respectively, showing a stacked structure of semiconductor layers for forming semiconductor laser devices in a state before the devices are isolated from each other.

As shown in FIGS. 7A and 7B, an n-type GaN layer 51 is formed as an under growth layer on a sapphire substrate 50, and a selective mask 52 made from silicon oxide is formed on the n-type GaN layer 51. The selective mask 52 has an opening portion 53 formed into a stripe shape extending longer in the [1–100] direction. A GaN layer 54 doped with silicon is formed as a semiconductor layer and a first conductive type cladding layer by selective growth from the opening portion 53. With respect to the GaN layer 54, the semiconductor layer is first formed by selective growth from the opening portion 53, and then the first conductive type cladding layer having the same composition as that of the semiconductor layer is formed on the semiconductor layer. In other words, the upper surface portion of the GaN layer 54 functions as the first conductive type cladding layer. An InGaN layer 55 is formed as the active layer on the GaN layer 54, and a GaN layer 56 doped with magnesium is formed as a second conductive type cladding layer on the InGaN layer 55.

The GaN layer 54 doped with silicon, which is formed by selective growth, has a ridge line extending in the [1–100] direction, and tilt planes 61 are formed on both sides of the ridge line. The tilt plane 61 is an S-plane, that is, the (1–100) plane extending in the [1–100] direction, which is the extending direction of the ridge line. The tilt planes 61 are stably formed upon selective growth. It is to be noted that the GaN layer 54 doped with silicon is not necessary formed into a triangular cross-sectional shape having the S-planes (tilt planes extending in the [1–100] direction) crossing each other at the ridge line by crystal growth, but may be formed into an approximately trapezoidal cross-sectional shape having the S-planes not crossing each other; that is, not having the ridge line by crystal growth performed by adjusting crystal growth conditions such as a crystal growth temperature and the content of each material forming the crystal.

Although the substrate made from sapphire is used in this embodiment, any other substrate may be used insofar as a wurtzite type compound semiconductor layer is formable thereon.

Examples of the substrates usable in this embodiment include substrates made from sapphire ($Al_2O_3$ having an A-plane, an R-plane, or a C-plane), SiC (having a structure of 6H, 4H, or 3C), GaN, ZnS, ZnO, AlN, and InAlGaN. In particular, such a material may be of a hexagonal system or cubic system; preferably, the hexagonal system. In the case of using the sapphire substrate as in this embodiment, the C-plane of sapphire may be taken as a principal plane of the substrate. The sapphire substrate with the C-plane of sapphire taken as a principal plane often has been used for growth of gallium nitride (GaN) based compound semiconductors. The C-plane of sapphire taken as a principal plane of the substrate used in this embodiment is not limited to a strict C-plane but may be tilted therefrom in a range of 5 to 6°.

The under growth layer, which is denoted by reference numeral 51 in this embodiment, may be made from a compound semiconductor. In the case of forming a semiconductor layer (the GaN layer 54 doped with silicon in this embodiment) on the under growth layer in the subsequent step, the under growth layer is preferably made from a wurtzite type compound semiconductor. For example, the under growth layer may be made from a wurtzite type compound semiconductor such as a group III based compound semiconductor, a BeMgZnCdS based compound semiconductor, BeMgZnCdO based compound semiconductor, an indium nitride (InN) based compound semiconductor, an indium gallium nitride (InGaN) based compound semiconductor, or an aluminum gallium nitride (AlGaN) based compound semiconductor. In particular, a nitride based semiconductor such as a gallium nitride based compound semiconductor is preferably used as the material of the under growth layer. It is to be noted that the under growth layer 51 in this embodiment is made from n-type GaN.

The compound semiconductor layer as the under growth layer 51 may be grown by any known vapor phase growth process; for example, a metal organic chemical deposition (MOCVD) (which is also called a metal organic vapor phase epitaxial growth (MOVPE) process), a molecular beam epitaxial growth (MBE) process, or a hydride vapor phase epitaxial growth (HVPE) process. In particular, the MOVPE process is advantageous in growing the compound semiconductor layer with good crystallinity at a high processing rate.

In the case of adopting the MOVPE process, alkyl metal compounds are used as Ga, Al and In sources. For example, TMG (trimethyl gallium) or TEG (triethyl gallium) is used as the Ga source, TMA (trimethyl aluminum) or TEA (triethyl aluminum) is used as the Al source, and TMI (trimethyl indium) or TEI (triethyl indium) is used as the In source. Further, in the MOVPE process, a gas such as ammonia or hydradine is used as a nitrogen source, silane gas is used as an Si (impurity) source, germanium gas is used as a Ge (impurity) source, Cp2Mg (cyclopentadienyl magnesium) is used as a Mg (impurity) source, and a DEZ (diethyl zinc) gas is used as a Zn (impurity) source. According to the MOVPE process, for example, an InAlGaN based compound semiconductor layer can be formed on a substrate by epitaxial growth performed by supplying the above gases to a front surface of the substrate, heated at 600° C. or more, to decompose the gases.

With respect to the first conductive type cladding layer 54, the active layer 55, and the second conductive type cladding layer 56 stacked on the tilt planes, the conductive type of the first conductive type cladding layer 54 is a p-type or n-type, and the conductive type of the second conductive type cladding type 56 is an n-type or p-type that is reversed to the conductive type of the first conductive type cladding layer 54. For example, in the case of forming a silicon-doped gallium nitride based compound semiconductor layer having the S-planes on the under growth layer, a double-hetero structure can be formed thereon by forming a silicon-doped gallium nitride based compound semiconductor layer as the n-type cladding layer on the above semiconductor layer, forming an InGaN layer as the active layer thereon, and forming a magnesium-doped gallium nitride based compound semiconductor as the n-type cladding layer.

The stacked structure may be configured such that the InGaN layer as the active layer be sandwiched between two AlGaN layers. The active layer may be configured as a single bulk active layer, but it also may be configured as a layer having a quantum well structure such as a single quantum well (SQW) structure, a double quantum well (DQW) structure, or a multiple quantum well (MQW)

structure. In the case of adopting the multiple quantum well structure, a barrier layer may be used for separating quantum wells from each other as needed. The use of the InGaN layer as the active layer is advantageous in facilitating the fabrication process, and also enhancing the light emission characteristic of the device. In addition, the InGaN layer is easier to be formed by crystal growth on the S-planes from which nitrogen atoms are difficult to be desorbed, so that the crystallinity of the InGaN layer formed on the S-planes is enhanced, thereby increasing the luminous efficiency.

A p-side electrode 57 is formed on the GaN layer 56 doped with magnesium as the second conductive type cladding layer. To reduce the contact resistance of the p-side electrode 57, a specific contact layer may be first formed on the GaN layer 56 and then multi-layer metal films may be formed thereon by vapor-deposition, to form the p-side electrode 57. The p-side electrode 57 may be composed of an electrode layer having a stacked structure of Ni/Pt/Au or Ni(Pd)/pt/Au. An n-side electrode 58 made from Au is formed in an opening portion formed in the selective mask 52 in such a manner as to be in electric-contact with the GaN layer 54 doped with silicon via the under growth layer 51. In addition, to desirably cleave the p-side electrode 57, each of the ends of the p-side electrode 57 extending in parallel to the ridge line may extend in approximately a straight line along a direction perpendicular to the extending direction of the ridge line.

After the p-side electrode 57 and the n-side electrode 58 are formed, a region, corresponding to a target semiconductor laser device, of the stacked structure is irradiated with energy beams, such as excimer laser beams, traveling from the back surface side of the substrate 50, to peel the target semiconductor laser device from the substrate 50 and isolate the target device from devices adjacent thereto, and simultaneously form resonance mirrors as cleavage planes.

Figure 8A:
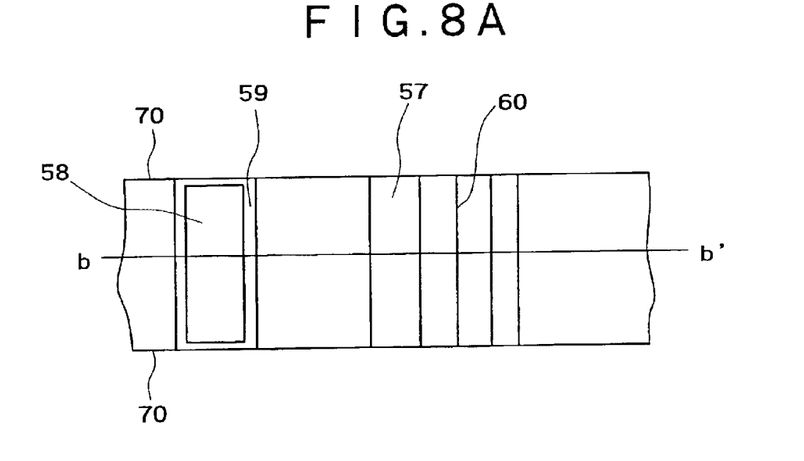
FIGS. 8A and 8B are a plan view and a sectional view taken along line b–b' of FIG. 8A, respectively, showing the stacked structure after the device is isolated, which structure is fabricated by the method of fabricating a semiconductor laser device according to the third embodiment.
Figure 8B:
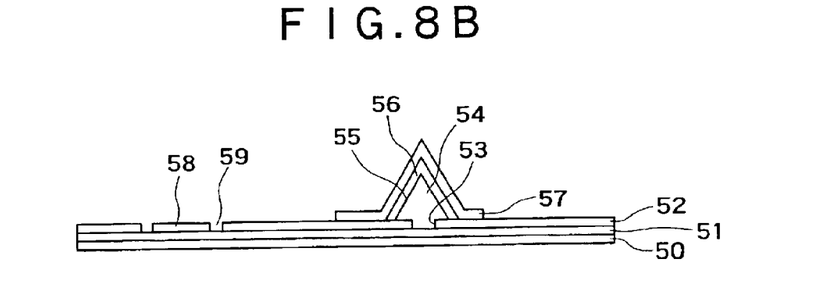

To be more specific, the excimer laser beams L, which are emitted to the region, corresponding to the target semiconductor laser device, through the back surface side of the substrate 50, reach the GaN layer 51 in the vicinity of the substrate 50, to cause abrasion of GaN of the GaN layer 12. Since the sapphire substrate 50 does not absorb the excimer laser beams L, the excimer laser beams L reach the GaN layer 51 while being little attenuated. The excimer laser beams L are absorbed by the n-type GaN layer 51, to decompose GaN of the n-type GaN layer 51 into gallium (Ga) and $N_2$ gas; thereby reducing a bonding force between the substrate 50 and the GaN layer 51. As a result, as shown in FIGS. 8A and 8B, the GaN layer 51 of the target device is peeled from the substrate 50 and also the target device is isolated from devices adjacent thereto.

At this time, the stacked structure, formed into the triangular shape in cross-section, composed of the n-type GaN layer 54, the InGaN layer 55, and the p-type GaN layer 56 is cleaved along the M-planes perpendicular to the [1–100] direction, which is the extending direction of the ridge line of the stacked structure. The device isolation plane composed of the M-plane formed by cleavage becomes a resonance mirror of the device, which plane is perpendicular to the InGaN layer as the light emission region.

In the case of forming a GaN base semiconductor layer by crystal growth, the semiconductor layer is easier to be cleaved as compared with cleavage along any other crystal plane. To be more specific, in the case of dividing a stacked structure composed of GaN based semiconductor layers into individual semiconductor devices, one of the semiconductor devices is cleaved from another preferentially along the M-planes, with a result that the semiconductor devices can be isolated from each other easily by cleavage.

In this way, according to this embodiment, a target semiconductor laser device with desirable resonance mirrors can be easily isolated from the stacked structure formed on the substrate.

The mask layer 52 can be cleaved along the M-planes by applying stress to the stacked structure 40. In particular, the strength of the cleaved region (along the M-plane) of the stacked structure 40 becomes weak and, accordingly, the mask layer 52 can be easily cleaved along a portion, in the vicinity of such a weak region, that is, along the M-plane.

The isolation plane, which is the M-plane formed by cleavage, of the target device is significantly flattened and has less damage of crystal. As a result, it is possible to enhance the performance of the semiconductor laser device by using the isolated plane having the M-plane as a resonance mirror.

Like the second embodiment, a window region may be formed in such a manner as to surround a target semiconductor laser device portion of the stacked structure having the triangular cross-sectional shape whose ridge line extends in the [1–100] direction. In this case, like the second embodiment, the window region is required not to cross the vicinities of both the ends of the stacked structure. With this configuration, the target device can be cleaved more easily.

In the method of fabricating a semiconductor laser device having a resonance mirror composed of a device isolation plane, the cleavage of a target device along the M-plane is advantageous in that it is possible to form a flat resonance mirror with less damage of crystal and to peel the target device from the substrate and simultaneously isolate the target device from devices adjacent thereto, and hence to improve the quality of the device and simultaneously simplify the fabrication process.

As described above, according to the method of fabricating a semiconductor laser device of the present invention, a stacked structure having a current constriction structure allowing waveguide of light in the [1–100] direction is formed, and a target semiconductor laser device is isolated by cleavage along the M-plane, (that is, the (1–100) plane) which is known to allow easy cleavage of crystal. Consequently, it is possible to obtain a semiconductor laser device having a flat resonance mirror with less damage of crystal. Further, according to the fabrication method of the present invention, a target semiconductor laser device is peeled from a substrate and the target device is simultaneously isolated from devices adjacent thereto by irradiating a target semiconductor laser device portion of a stacked structure formed on the substrate with energy beams, to cause abrasion of the lowermost layer of the target device and, consequently, it is possible to simplify the fabrication process and hence to reduce the fabrication cost.

As a result, according to the method of fabricating a semiconductor laser device of the present invention, it is possible to obtain large advantages in simplifying the fabrication process and thereby reducing the fabrication cost while enhancing the quality of the semiconductor laser device.

Although the present invention has been described with reference to specific embodiments, those of skill in the art will recognize that changes may be made thereto without departing from the spirit and scope of the present invention as set forth in the hereafter appended claims.

What is claimed is:

1. A method of fabricating a semiconductor laser device, the method comprising the steps of:
   forming semiconductor layers composed of a first conductive type cladding layer, an active layer, and a second conductive type cladding layer on a substrate; and peeling a device formation region of the semiconductor layers from the substrate and simultaneously forming a resonance mirror on an end portion of the device formation region by irradiating the device formation region with energy beams traveling from a back surface side of the substrate.

2. A method of fabricating a semiconductor laser device as claimed in claim 1, wherein each of the semiconductor layers has a wurtzite type crystal structure.

3. A method of fabricating a semiconductor laser device as claimed in claim 1, wherein each of the semiconductor layers is a GaN based compound semiconductor layer.

4. A method of fabricating a semiconductor laser device as claimed in claim 1, wherein the first conductive type cladding layer is made from $Al_xIn_yGa_{1-x-y}N$ ($0 \leq x \leq 1$, $0 \leq y \leq 1$).

5. A method of fabricating a semiconductor laser device as claimed in claim 1, wherein the resonance mirror is one of an M-plane and a (1–100) plane.

6. A method of fabricating a semiconductor laser device as claimed in claim 1, wherein a principal plane of the substrate is a C-plane.

7. A method of fabricating a semiconductor laser device as claimed in claim 1, wherein the energy beam is an excimer laser beam.

8. A method of fabricating a semiconductor laser device as claimed in claim 1, wherein a projecting rib extending in a [1–100] direction is formed by partially removing the second conductive type cladding layer.

9. A method of fabricating a semiconductor laser device as claimed in claim 1, wherein a window region allowing formation of an end portion of the device formation region by peeling the device formation region from the substrate is formed.

10. A method of fabricating a semiconductor laser device as claimed in claim 9, wherein the window region is formed by removing the semiconductor layers with a portion of the semiconductor layers remaining, with the portion having a distance determined to allow cleavage of the semiconductor layers when the semiconductor layers are peeled from the substrate.

11. A method of fabricating a semiconductor laser device as claimed in claim 9, wherein the window region is formed by removing the semiconductor layers until the substrate is exposed.

12. A method of fabricating a semiconductor laser device, the method comprising the steps of:
forming a selective growth mask having an opening portion formed on a base body;
forming a crystal layer by selective growth from the opening portion;
forming semiconductor layers composed of a first conductive type cladding layer, an active layer, and a second conductive type cladding layer on the crystal layer; and
peeling a device formation region of the crystal layer and the semiconductor layers from the base body and simultaneously forming a resonance mirror on an end portion of the device formation region by irradiating the device formation region with energy beams traveling from a back surface side of the base body.

13. A method of fabricating a semiconductor laser device as claimed in claim 12, wherein the opening portion is formed into a stripe shape.

14. A method of fabricating a semiconductor laser device as claimed in claim 12, wherein a principal plane of the base body is a C-plane.

15. A method of fabricating a semiconductor laser device as claimed in claim 12, wherein the crystal layer is a tilt crystal layer tilted from a principal plane of the base body.

16. A method of fabricating a semiconductor laser device as claimed in claim 12, wherein a longitudinal direction of the opening portion is parallel to a [1–100] direction.

17. A method of fabricating a semiconductor laser device as claimed in claim 12, wherein a projecting rib extending in a [1–100] direction is formed by partially removing the second conductive type cladding layer.

18. A method of fabricating a semiconductor laser device as claimed in claim 12, wherein each of the semiconductor layers has a wurtzite type crystal structure.

19. A method of fabricating a semiconductor laser device as claimed in claim 12, wherein the crystal layer is a GaN based compound semiconductor layer.

20. A method of fabricating a semiconductor laser device as claimed in claim 19, wherein the GaN based compound semiconductor layer is made from $Al_xIn_yGa_{1-x-y}N$ ($0 \leq x \leq 1$, $0 \leq y < 1$).

21. A method of fabricating a semiconductor laser device as claimed in claim 19, wherein the active layer has an S-plane.

22. A method of fabricating a semiconductor laser device as claimed in claim 19, wherein the resonance mirror has one of an M-plane and a (1–100) plane.

23. A semiconductor laser device, comprising:
semiconductor layers composed of a first conductive type cladding layer, an active layer, and a second conductive type cladding layer, the semiconductor layers being formed on a substrate, wherein a device formation region of the semiconductor layers is peeled from the substrate and a resonance mirror is simultaneously formed on an end portion of the device formation region by irradiating the device formation region with energy beams traveling from a back surface side of the substrate.

24. A semiconductor laser device as claimed in claim 23, wherein a projecting rib extending in a [1–100] direction is formed by partially removing the second conductive type cladding layer.

25. A semiconductor laser device, comprising:
a base body;
a selective growth mask having an opening portion formed into a stripe shape, the selective growth mask being formed on a base body;
a crystal layer formed by selective growth from the opening portion; and
semiconductor layers composed of a first conductive type cladding layer, an active layer, and a second conductive type cladding layer, the semiconductor layers being formed on the crystal layer;
wherein a device formation region of the crystal layer and the semiconductor layers is peeled from the base body and a resonance mirror is simultaneously formed on an end portion of the device formation region by irradiating the device formation region with energy beams traveling from a back surface side of the base body.

26. A semiconductor laser device as claimed in claim 25, wherein a projecting rib extending in a [1–100] direction is formed by partially removing the second conductive type cladding layer.

27. A semiconductor laser device as claimed in claim 25, wherein a longitudinal direction of the opening portion is parallel to a [1–100] direction.

28. A semiconductor laser device as claimed in claim 25, wherein the crystal layer is a tilt crystal layer tilted from a principal plane of the base body.

29. A semiconductor laser device as claimed in claim 25, wherein the active layer has an S-plane.

* * * * *